(12) United States Patent
Jelonnek

(10) Patent No.: US 6,577,259 B1
(45) Date of Patent: Jun. 10, 2003

(54) SIGMA-DELTA MODULATOR

(75) Inventor: Bjoern Jelonnek, Ulm (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/110,049

(22) PCT Filed: Oct. 6, 2000

(86) PCT No.: PCT/DE00/03535

§ 371 (c)(1),
(2), (4) Date: Apr. 8, 2002

(87) PCT Pub. No.: WO01/26234

PCT Pub. Date: Apr. 12, 2001

(30) Foreign Application Priority Data

Oct. 7, 1999 (DE) .......................... 199 48 374

(51) Int. Cl.[7] .............................. H03M 3/00
(52) U.S. Cl. .................. 341/143; 341/144; 341/159
(58) Field of Search ................. 341/143, 144, 341/145, 159, 141

(56) References Cited

U.S. PATENT DOCUMENTS

| | | | | |
|---|---|---|---|---|
| 5,225,835 A | * | 7/1993 | Majima et al. ............. | 341/143 |
| 5,369,403 A | * | 11/1994 | Temes et al. ............... | 341/143 |
| 5,416,483 A | * | 5/1995 | Matsuya .................... | 341/143 |
| 5,870,048 A | * | 2/1999 | Kuo et al. .................. | 341/143 |
| 6,255,977 B1 | * | 7/2001 | Jelonnek et al. ........... | 341/143 |
| 6,323,794 B1 | * | 11/2001 | Okuda et al. ............... | 341/143 |

FOREIGN PATENT DOCUMENTS

| | | |
|---|---|---|
| EP | 0506079 A1 | 9/1992 |
| EP | 0551690 A1 | 7/1993 |

OTHER PUBLICATIONS

Norsworthy et al., "Delta–Sigma Data Converters–Theory, Design, and Simulation," IEEE Circuits & Systems Society, The institute of Electrical and Electronics Engineers, Inc., New York, IEEE Press, 1997.

* cited by examiner

*Primary Examiner*—Brian Young
*Assistant Examiner*—John Nguyen
(74) *Attorney, Agent, or Firm*—Staas & Halsey LLP

(57) ABSTRACT

A sigma-delta modulator for converting time-discrete samples into corresponding analog signals in, in particular, digital radio communication systems, is characterized by the fact that a first-order sigma-delta modulator is parallelized and a higher-order cascaded sigma-delta modulator is constructed of a number of first-order parallelized structures.

7 Claims, 8 Drawing Sheets

SIGMA-DELTA MODULATOR

CROSS REFERENCE TO RELATED APPLICATIONS

This application is based on and hereby claims priority to PCT Application No. PCT/DE00/03535 filed on Oct. 6, 2000 and German Application No. 199 48 374.4 filed on Oct. 7, 1999, the contents of which are hereby incorporated by reference.

BACKGROUND OF THE INVENTION

The invention relates to a sigma-delta modulator for converting time-discrete samples into corresponding analog signals.

In digital/analog converters such as are used, for example, in digital radio communication devices, a digital input signal with $2^n$ signal states and a fixed sampling frequency $f_a$ is usually changed into an analog signal which should correspond as well as possible to the digital signal in the frequency range from $-f_a/2$ to $+f_a/2$.

It is particularly at high bit widths n that the number of signal states to be achieved by analog circuit technology represents a significant problem. For this reason, a digital signal is interpolated by digital filters and so-called sigma-delta modulators are used which distinctly reduce the bit width n of a digital signal at increased sampling frequency and transform the quantization noise generated by this into previously unused frequency ranges. In this arrangement, structures which achieve noise shaping, which are comparable to a shaping which can be achieved by higher-order IIR (Infinite Impulse Response) filters, are particularly efficient.

In the case of the sigma-delta modulators, there are two approaches for achieving noise shaping. According to a first approach, higher-order feedback loops are used, which allows a reduction to up to two signal states (1-bit signal technique), but leads to possible instabilities at high input signals above third-order noise shaping. Excesses very easily occur in the range of values. To counteract this, an amplitude-reduced input signal and state memories with clipping characteristics are used in practice, which allows an empirically determined stability of the circuit to be achieved.

According to another approach, first- and/or second-order structures are cascaded which are multi-stage structures and, as a result, exhibit a stable operating characteristic.

Known structures of sigma-delta modulators operate serially and at a high clock rate, since the sigma-delta modulators are feedback structures with non-linear elements. A detailed representation of the theory and the structure of sigma-delta modulators are provided in S. R. Norswothy, R. Schreier, G. Temes: "Delta-Sigma Data Converters, Theory, Design and Simulation", IEEE Press 1997, ISBN 0-7803-1045-4.

Due to the noise shaping aimed for, the sigma-delta modulator of a typical digital/analog converter operates in a time- and value-discrete manner at a clock frequency which is much higher than the maximum signal frequency used. It has feedback filters and nonlinear substructures which prevent these structures from being implemented at a lower clock rate.

One aspect of the invention is based on the object of developing a structure for a sigma-delta modulator which operates at a lower clock rate and thus more inexpensively and with power-saving technology.

SUMMARY OF THE INVENTION

According to one aspect of the invention, the object is achieved by a first-order sigma-delta modulator being parallelized and a higher-order cascaded sigma-delta modulator being created out of a number of parallelized first-order structures.

One aspect of the invention achieves the result that sigma-delta modulators can be achieved which have a lower sampling clock rate and thus less circuit expenditure and are more inexpensive.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
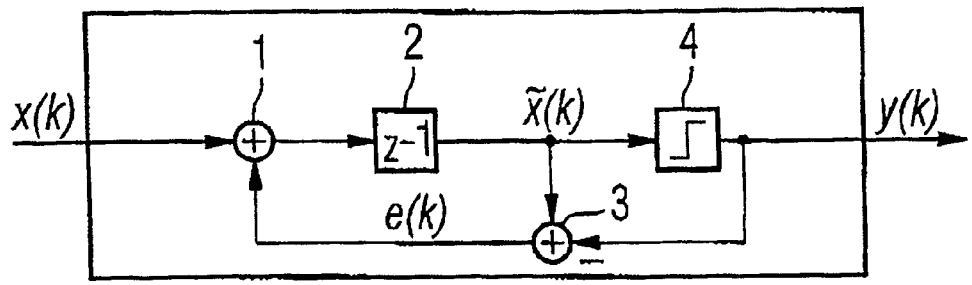
FIG. 1 shows a first-order sigma-delta modulator according to the known prior art.

Reference will now be made in detail to the preferred embodiments of the present invention, examples of which are illustrated in the accompanying drawings, wherein like reference numerals refer to like elements throughout.

One aspect of present invention is based on a known first-order sigma-delta modulator as shown diagrammatically in FIG. 1. Without restricting the generality of the invention, the input signal x(k) will be normalized to the range of numbers $-1 \leq x(k) \leq 1$ and the step height of the quantizer will be assumed to be $2/(L-1)$ in the subsequent discussion, where L specifies the number of quantization levels. The digital sigma-delta modulator converts the digital input signal x(k) into a 3-step (1.5 bit) data stream as output signal y(k). It should be clear that any type of quantizer or something equivalent can be used for performing the conversion into a quantized digital data stream.

The digital input signal x(k) is input into an adder 1, the output of which is conducted to a delay circuit 2. The output of the delay circuit 2 is conducted to an adder 3 and, at the same time, to the input of a decision circuit 4 in which the signal $\tilde{x}(k)$, delayed in the delay circuit 2 by one clock unit compared with the signal x(k), is quantized into the specified number of quantization levels which are restricted to the set (−1, 0, +1) in the example. In the adder 3, a quantization error signal e(k) is formed from the sum of the output signal $\tilde{x}(k)$ of the delay circuit 2 and the negated output signal y(k) of the decision circuit 4 due to the nonlinearality of the quantizer, which quantization error signal is supplied to the adder 1 at the input of the delay circuit 2 for the purpose of addition to the input signal x(k).

Figure 2:
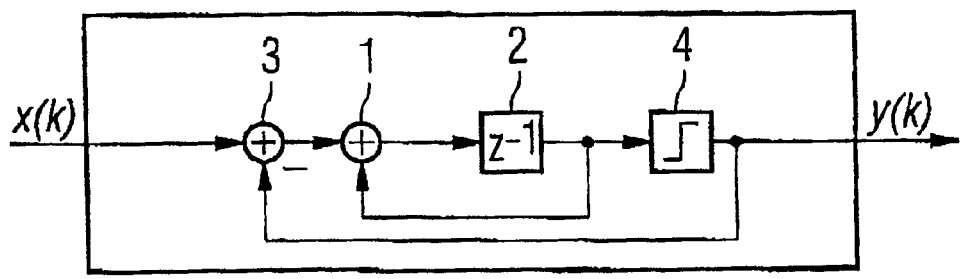
FIG. 2 shows a modification of the first-order sigma-delta modulator according to FIG. 1.

According to FIG. 2, the known first-order sigma-delta modulator according to FIG. 1 is changed in a first step into a first-order IIR (Infinite Impulse Response) filter (delay circuit 2, adder 1, feedback branch) which can be considered as an integrator, and into a decision circuit 4. IIR=Infinite Impulse Response Filter (digital filter with infinite impulse response).

The input signal x(k) is fed via the integrator into the decision circuit 4 and the quantized output signal y(k) is conducted back to the input in order to be subtracted from the input signal x(k). The signal $\tilde{x}(k)$, delayed by one clock unit, is directly conducted via a feedback branch to the adder 1 which is also supplied with the difference from the input signal x(k) at the output signal y(k) which is formed in the adder 3.

Such a sigma-delta modulator is described on page 6 of the IEEE publication initially designated and is shown there as a block diagram in FIG. 1.4.

In a next step, the first-order IIR filter according to FIG. 2 is split into an FIR filter 5 and an IIR filter (delay circuit 2, adder 1, feedback branch), which operates at a lower clock rate. Equation (1) specifies how the transfer characteristic of the IIR filter can be split into the two part-filters FIR and IIR:

$$\frac{1}{1-az^{-1}} = \left(\sum_{v=0}^{\lambda-1} a^v z^{-v}\right) \frac{1}{1-a^\lambda z^{-\lambda}} \quad (1)$$

where z=exp (jωT),

α=pole point of the first-order IIR filter

λ=clock ratio between output and input clock

An FIR (Finite Impulse Response) filter is a filter with infinite impulse response and is characterized by a high stability.

In the case of an integrator as used in FIG. 2, the pole point is α=1 and equation (1) can be changed into equation (2):

$$\frac{1}{1-z^{-1}} = \left(\sum_{v=0}^{\lambda-1} z^{-v}\right) \frac{1}{1-z^{-\lambda}} \quad (2)$$

Figure 3:
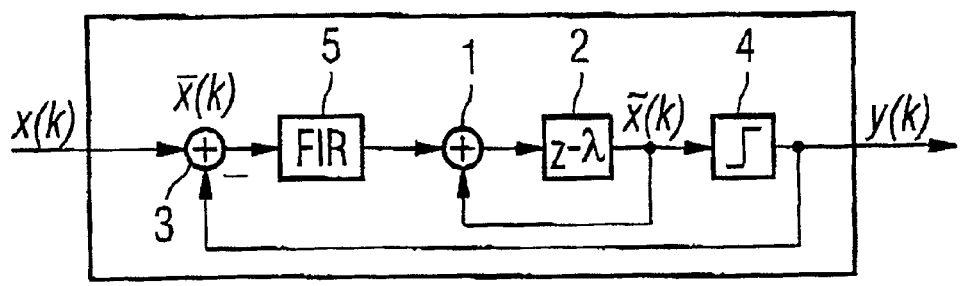
FIG. 3 shows a continuing modification of the first-order sigma-delta modulator with FIR and IIR part-filters.

A structure according to FIG. 3 is obtained, with two part-filters FIR and IIR. The FIR filter 5 is arranged between the adders 3 and 1. If the input signal $\tilde{\chi}(k)$ of the two implementations of the IIR filter is the same, the same output signal $\tilde{x}(k)$ is also obtained.

Figure 4:
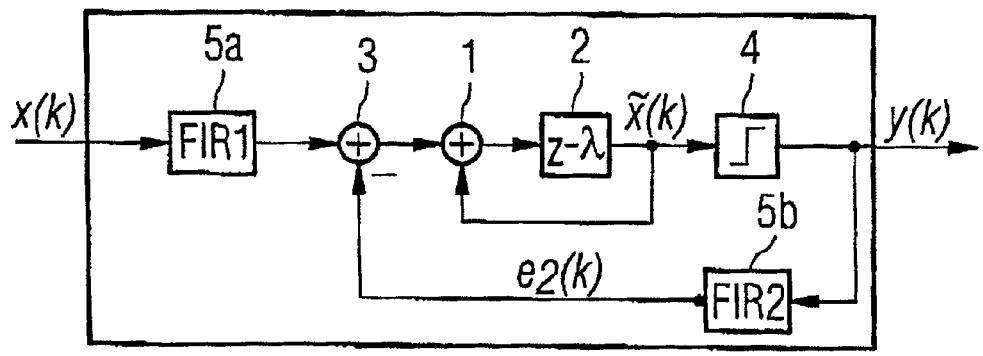
FIG. 4 shows a continuing modification according to FIG. 3 with transposed arrangement of the FIR filter (part-filters FIR1, FIR2) with the adder at the input of the first-order sigma-delta modulator.

The processing of the values in the FIR filter 5 and the addition in the adder 3 are linear operations, which is why filter 5 and adder 3 can be transposed. This is shown in FIG. 4. The FIR filter 5 is stripped into two FIR part-filters (FIR1, FIR2) 5a, 5b in order also to include the branch from output signal y(k) to adder 3 in accordance with its functions.

Figure 5:
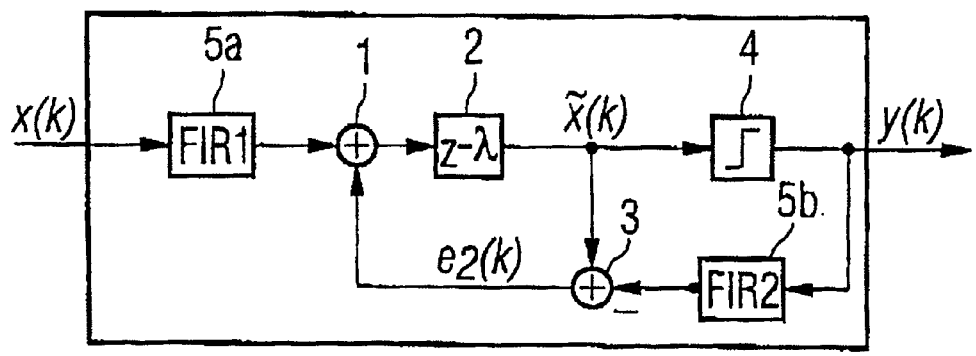
FIG. 5 shows a continuing modification according to FIG. 4 with combining of the output signals from the IIR and FIR2 filter.

In a next step, the output signals from the IIR filter (delay circuit 2, adder 1, feedback branch) and FIR2 filter 5b according to FIG. 5 are combined again in the adder 3.

In the filter FIR2 5b, the last λ−1 decision circuit output values are added. If the quantizer uses L steps, the signal at the output of the filter FIR2 5b has (L−1)λ+1 steps. Thus, the combination of FIR2 5b and decision circuit 4 can be considered as a multi-bit quantizer 4*.

Figure 6:
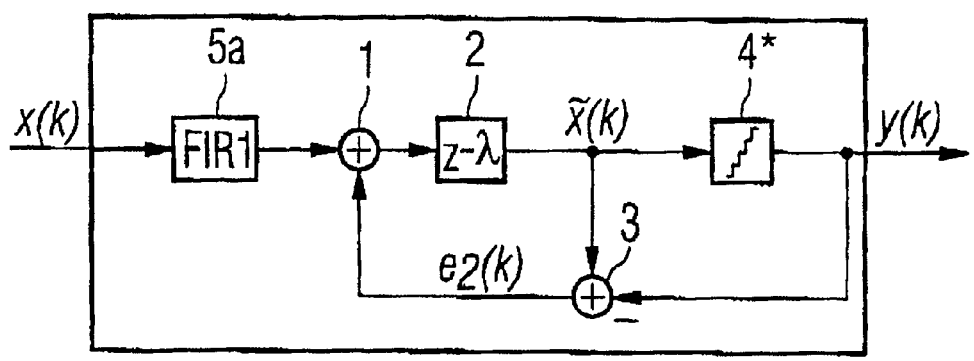
FIG. 6 shows a continuing modification of a first-order sigma-delta modulator according to FIG. 5 with combining of the part-filter FIR2 and of the quantizer to form a multi-bit quantizer.

In accordance with the derivation conducted above, FIR1 filter 5a and IIR part-filters (delay circuit 2, adder 1, feedback branch) in FIG. 6 reproduce an integrator as used in FIG. 1. In both cases, a multiple of the quantization level is subtracted from the integration result. Since the quantization error is restricted to the same unambiguous range both in the structure shown in FIG. 6 and in the structure of a sigma-delta converter shown in FIG. 1, the quantization error of the structures of FIG. 1 and FIG. 6 is identical.

$$e_{2(k)} = e(k) \quad (3)$$

Figure 7:
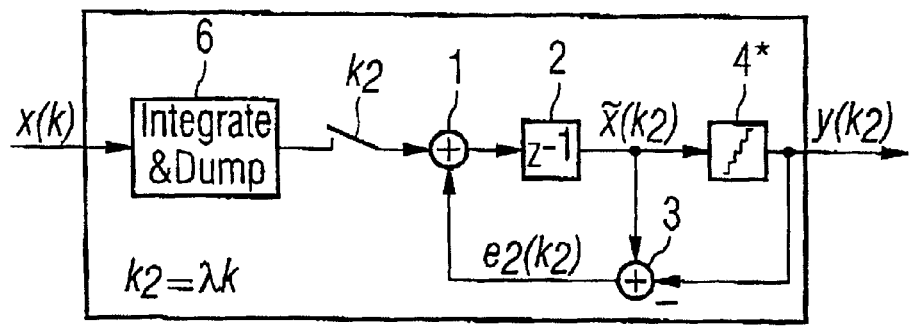
FIG. 7 shows a continuing modification of a first-order sigma-delta modulator according to FIG. 6 with replacement of the part-filter FIR1 by an Integrate &- Dump filter.

In the part-structure with feedback of FIG. 6, a delay by λ instants is performed. If it is intended to determine the quantization error values $e_2(k)$ only sub-sampled every λ instants, the calculation can be performed at low clock rate: the part-filter FIR1 5a is replaced by an integrate&dump filter 6 and the time delay of the low clock rate is used. This is illustrated in FIG. 7.

Figure 8:
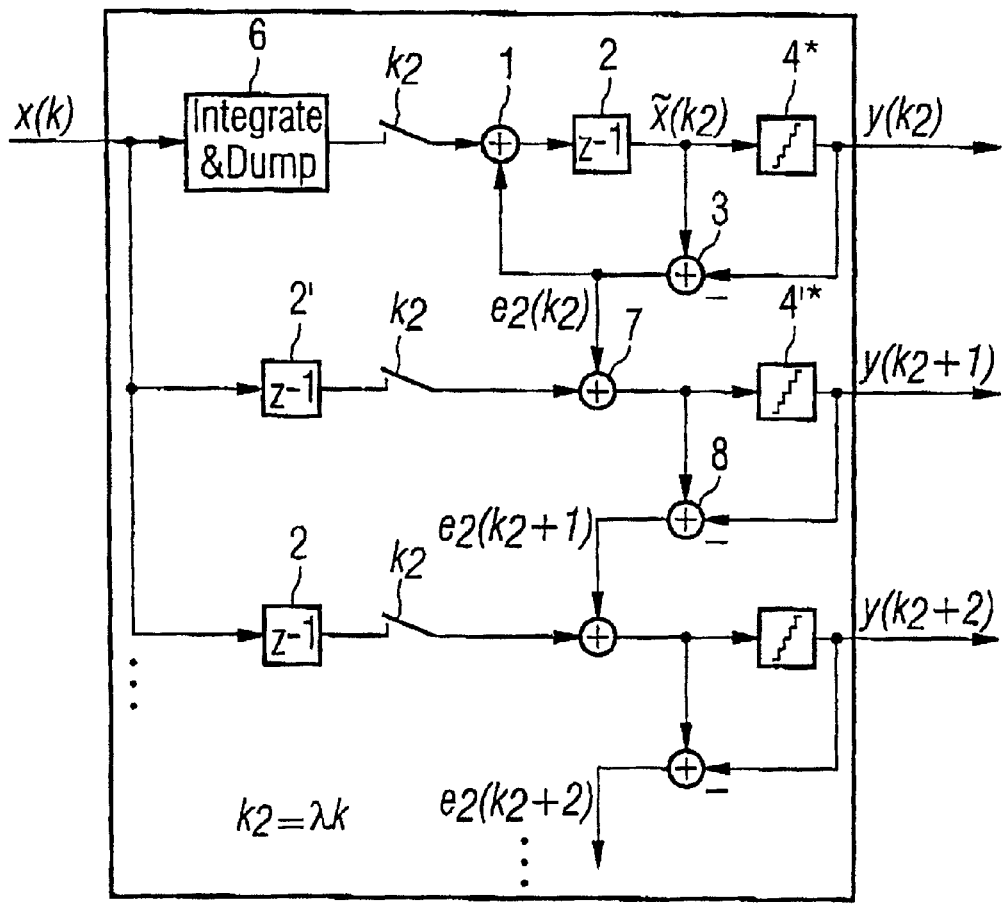
FIG. 8 shows an arrangement of a first-order sigma-delta modulator according to FIG. 7 which is expanded for calculating missing truth values of the quantization error.

Using the sigma-delta modulator developed further according to FIG. 8 provides interpretation nodes for the truth values of a modulator operating at a high clock rate (clock rate $k_2=\lambda k$). The missing truth values of the quantization error ($e_2(k_2+1)$, $e_2(k_2+2)$, . . . ) can be derived free of recursion from the parallelized arrangement; they are no longer included in the recursion loop which leads from the output of the multi-bit quantizer 4* to the adder 1. The quantization error $e_2(k_2)$ is conducted to an adder 7 arranged between a downstream delay circuit 2' and a multi-bit quantizer 4'* for calculating the quantization error value $e_2(k_2+1)$ following in time. In addition, the negated output signal $y(k_2+1)$ of the multi-bit quantizer 4'* is input to another adder 8 which forms from this and from the output signal of the adder 7 the error signal $e_2(k_2+2)$. This process is repeated for all truth values of the quantization error $e_2(k_2+1)$ . . . $e_2(k_2+\lambda-1)$ to be calculated.

From the values of the quantization error $e_2(k)$ and of the input signal x(k), the numerical value of the quantizer 4 can be calculated by a logic:

$$y(k) = e_2(k-1) + x(k) - e_2(k) \quad (4)$$

In the figures following, the implementation of a parallelized cascaded third-order sigma-delta modulator with output values of −4 . . . +4 and a factor λ=16 is shown as an example of an application. Each first-order subsystem of this parallelized cascaded sigma-delta modulator generates 16 3-level (1.5 bit) output signals. However, the application of the structures shown here is obviously not restricted only to the special cases of 1.5 bits and λ=16.

Figure 9:
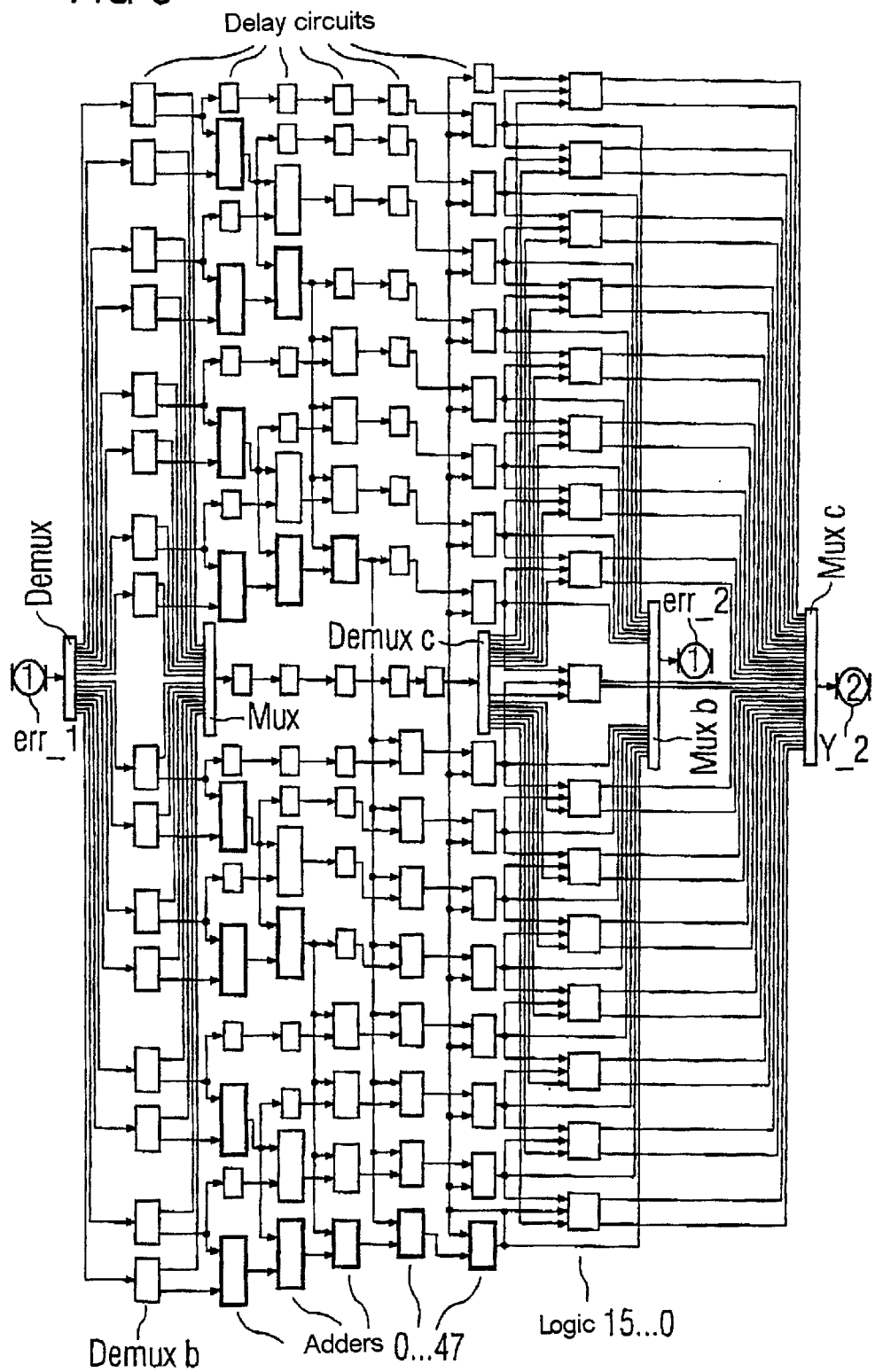
FIG. 9 shows a structure according to one aspect of the invention of a parallelized first-order sigma-delta modulator.

The following representation is based on the parallel implementation of a first-order sigma-delta modulator shown in FIG. 9. The 16 input signals of this example are combined in the signal err 1. These signals are separated by the demultiplexer Demux and subsequently supplied to the individual demultiplexers Demux b 0 . . . 15.

These demultiplexers separate their respective input signals into two part-signals:

One part-signal (sgn) includes the most significant bit (MSB) and the second most significant bit (2nd) MSB and is supplied to the logic blocks b 0 . . . 15 time-delayed via Mux, delay elements and Demux c.

A second part-signal (amp) includes the input signal of the demultiplexer Demux b, reduced by the MSB, and is fed into an arithmetic logic unit.

As can be seen from the subsequent transformation, the splitting results in a reduction of the 3-level first-order sigma-delta modulator to a part-signal and a first-order 2-level sigma-delta modulator, which is simple to achieve:

Let the input signal be normalized to the range of numbers $-1 < x(k) \leq 1$ without restriction of its generality. Then, $x(k)$ can be represented as follows:

$$x(k) = amp(k) + s(k) \quad (5)$$

where $$s(k) \in \quad (6)$$

and $$0 \leq amp(k) < 1 \quad (7)$$

holds true. The equation of a 1.5-bit quantizer $$y(k) = \begin{cases} 1 & \text{if } e(k-1) + x(k) \geq 0.5 \\ -1 & \text{if } e(k-1\_ + x(k) < -0.5 \\ 0 & \text{else} \end{cases} \quad (8)$$

can thus be transformed into:

$$y(k) = \begin{cases} 1 & \text{if } e(k-1) + amp(k) = s(k) \geq 0.5 \\ -1 & \text{if } e(k-1\_ + amp(k) + s(k) < -0.5 \\ 0 & \text{else} \end{cases} \quad (9)$$

The quantization error $e(k)$ of the first-order 1.5-bit sigma-delta modulator is restricted to the range of values $-0.5 \leq e(k) < 0.5$. Since only $s(k)$ can cause the threshold −0.5 to be exceeded, it follows that:

$$y(k) = s(k) + \begin{cases} 1 & \text{if } e(k-1) + amp(k) \geq 0.5 \\ 0 & \text{else} \end{cases} \quad (10)$$

FIG. 9 shows the parallelization of the 1-bit sigma-delta converter section according to FIG. 8. The integrate&dump filter and the multi-bit sigma-delta modulator are emphasized by shading. The overflow characteristic of the twos complement arithmetic is utilized as quantizer. The structures not emphasized calculate the abovementioned truth values of the quantization error of the sigma-delta modulator. From the quantization error and knowledge of the input signal which is forwarded by delay circuits from the multiplexer MUX to the demultiplexer DEMUC c (center FIG. 10), the values of the quantizer are determined by a logic which is shown in greater detail in FIG. 13 and FIG. 14.

Figure 10:
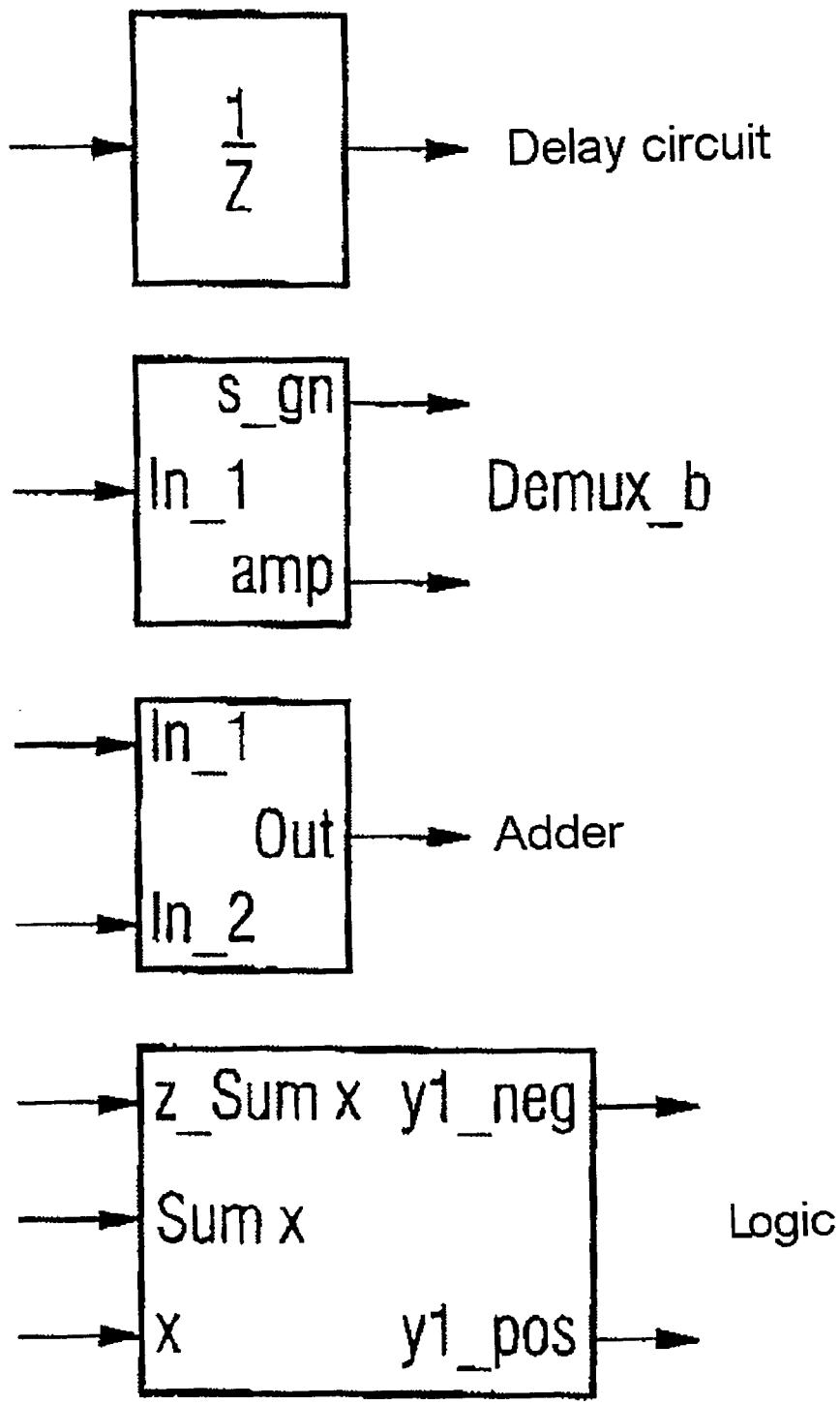
FIG. 10 shows modules drawn out of FIG. 9.

The allocations of the terminals of the elements used: delay circuit with one input and one output, Demux b with one input and two outputs (In 1, s gn, amp), adder with two inputs and one output (In 1, In 2, Out), logic b with three inputs and two outputs (z sum x, sum x, x, yl neg, y2 pos) from FIG. 9 are shown in greater detail in FIG. 10.

The delay circuit used in FIG. 9 holds the value of its input signal for one unit of time.

The function of Demux b has already been discussed above: one part-signal (s gn) includes the MSB and the 2nd MSB and is supplied with a time delay via Mux, delay elements and Demux c to the logic blocks b 0 . . . 15. A second part-signal (amp) includes the input signal of the demultiplexer Demux b reduced by the MSB and is fed into an arithmetic logic unit.

A wrap-around adder with L−1 stages is used.

The logic b reproduces the function of equation 4. It is shown again in greater detail in FIGS. 12 and 13.

Figure 11:
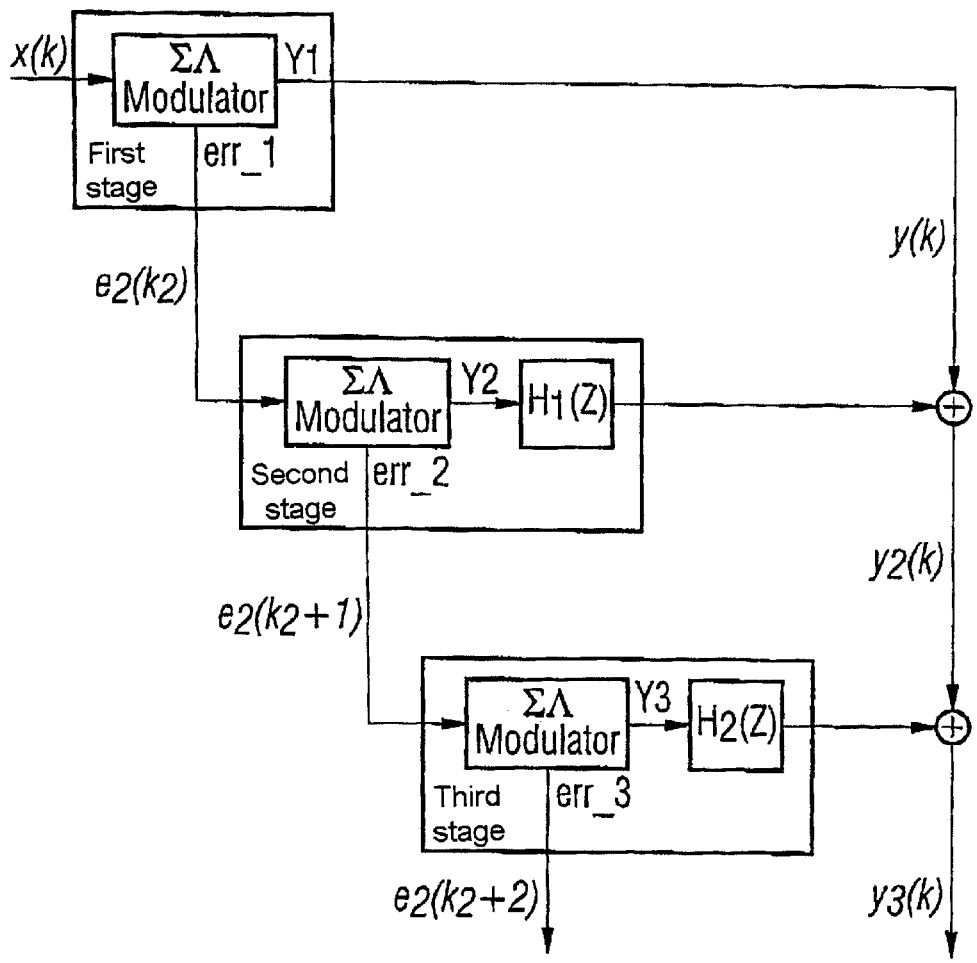
FIG. 11 shows an implementation according to one aspect of the invention of a higher-order sigma-delta modulator cascaded from three stages of a first-order sigma-delta modulator.

FIG. 11 shows the overall model in which 3 stages of a parallelized first-order sigma-delta modulator are cascaded to form a third-order sigma-delta modulator. The three cascades are shown underneath one another. The system resembles a system of cascaded sigma-delta modulators without parallelizing. The digital input signal x(k) is conducted to the first stage—a parallelized first-order sigma-delta converter according to FIG. 9—which converts the digital input signal output by the interpolation filter into a digital parallel m-bit data stream Y1 at the output (m≧1). The output error signal $e2(k_2)$ from the output err 1 of the first sigma-delta modulator is supplied to the second cascade (illustrated in the center in FIG. 11) analogously to FIG. 8 and FIG. 9, and is processed there in the same manner etc.

The output signals from output Y2 are filtered by the FIR filter:

$$H_1(z) = 1 - z^{-1} \quad (11)$$

and those from output Y3 are filtered by the FIR filter:

$$H_2(z) = (1 - z^{-1}) \quad (12)$$

and combined to form an output signal of the third-order sigma-delta converter $y_3(k)$.

$$y(k) = \begin{cases} -1 & \text{if} & ((e(k) \geq 0) \wedge (e(k-1) < 0) \wedge (x(k) < 0)) \vee ((e(k) \geq 0) \wedge \\ & & (x(k) < -0.5)) \vee ((e(k-1) < 0) \wedge (x(k) < -0.5)) \\ 1 & \text{if} & ((e(k) < 0 \wedge (e(k-1) \geq 0) \wedge (x(k) \geq 0)) \vee \\ & & ((e(k) < 0) \wedge (x(k) \geq -0.5)) \vee ((e(k-1) \geq 0) \wedge (x(k) \geq -0.5)) \\ 0 & \text{else} \end{cases} \quad (13)$$

Figure 12:
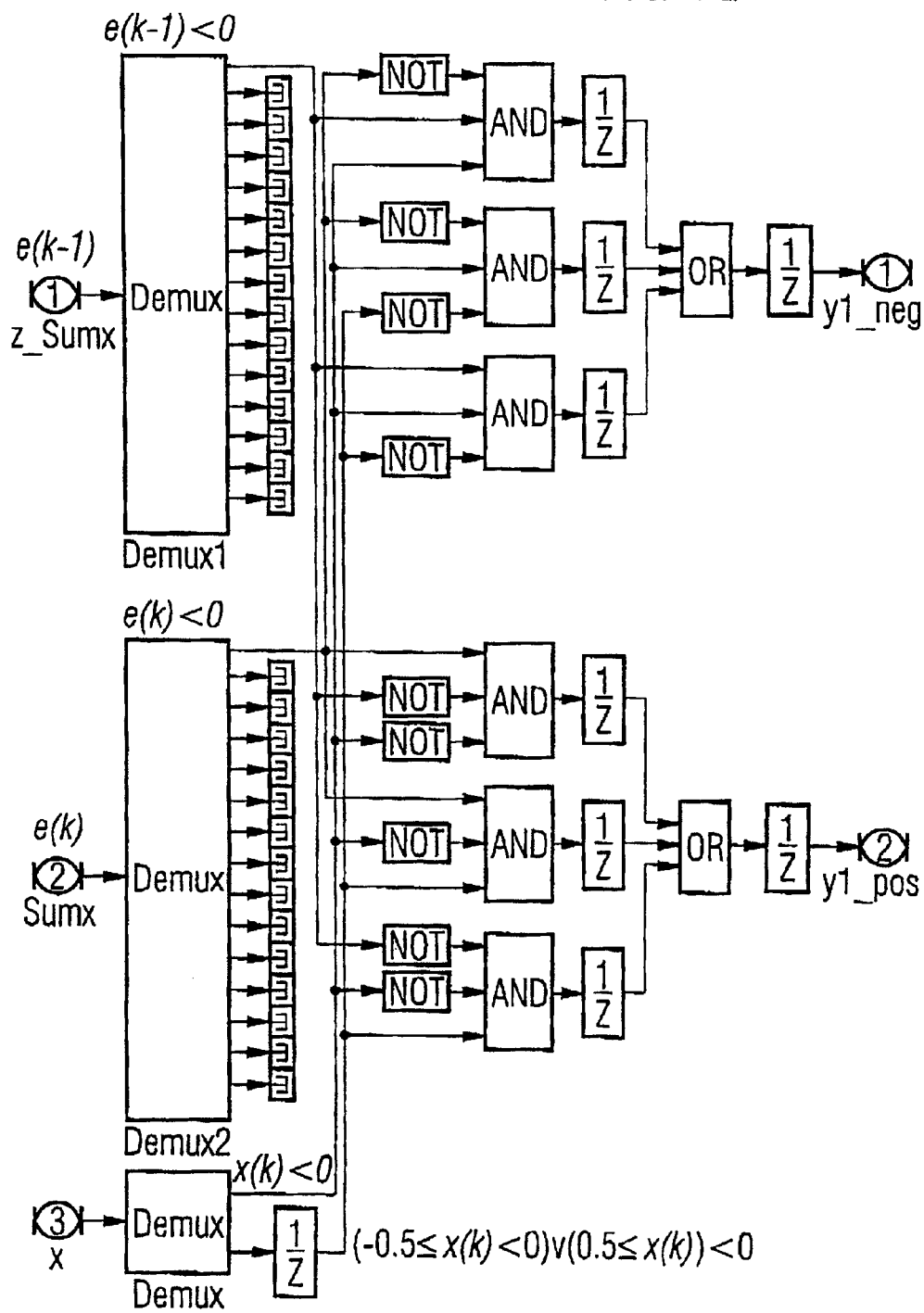
FIG. 12 shows a logic module for the first stage of a sigma-delta modulator for determining the values of the quantizer from the quantization error and the input signal.
Figure 13:
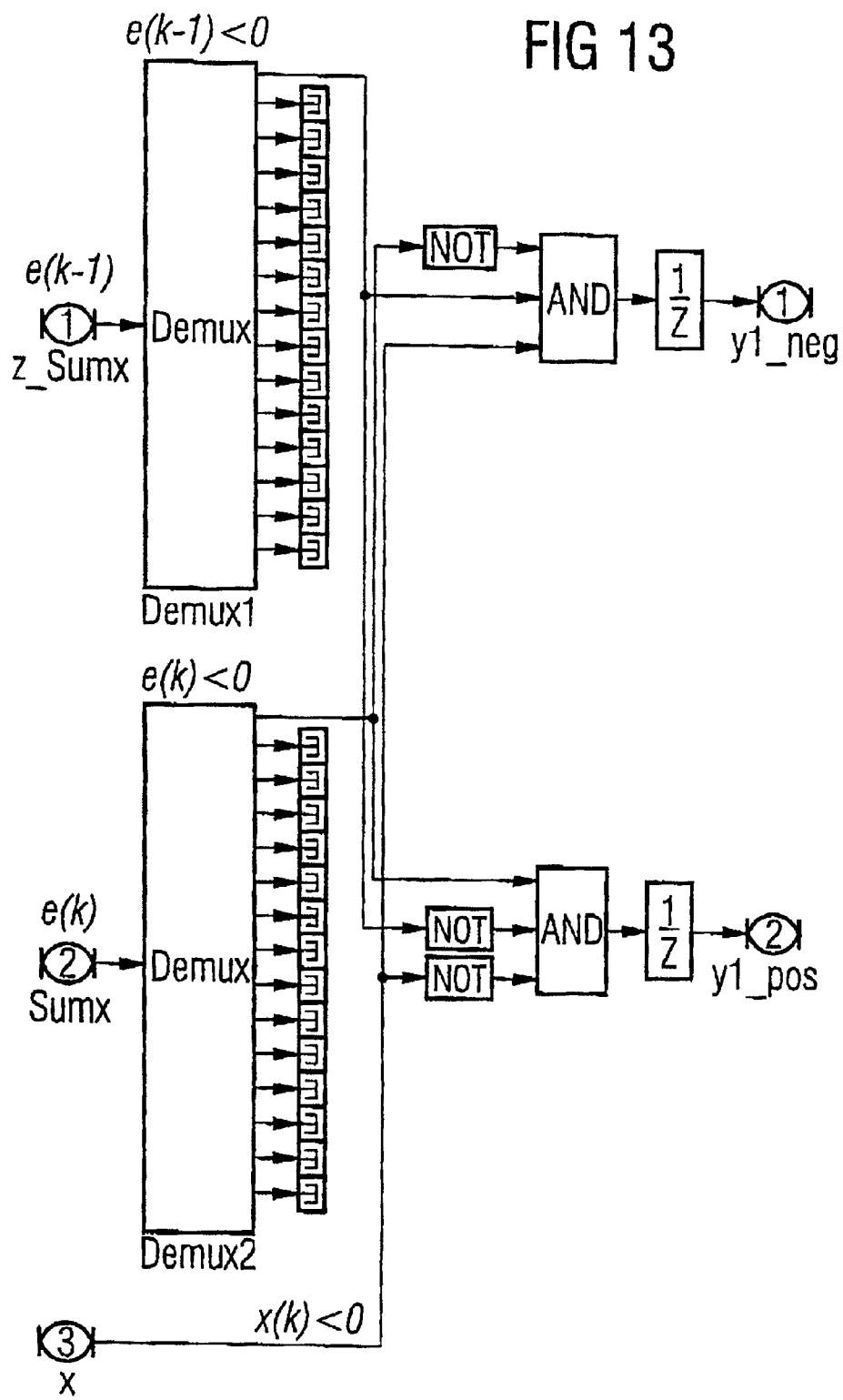
FIG. 13 shows a logic module for the second and subsequent stages of a sigma-delta modulator for determining the values of the quantizer from the quantization error and the input signal.

FIG. 12 shows the internal configuration of a logic b element in detail for the first stage of the sigma-delta modulator from FIG. 9 and FIG. 11, respectively. In this configuration, the function of equation (4) is implemented. The output signal of the quantizer 4 only has the three states −1, 0, 1. To identify the respective state, it is not necessary to execute the addition or subtraction exactly. Instead, it is sufficient to provide information on the range of numbers in which $e_2(k)$, $e_2(k-1)$ or $x(k)$ is located:

FIG. 13 shows the internal configuration of a logic b element in detail for the second and subsequent stages of the sigma-delta modulator from FIG. 11. The error signal from preceding stages is restricted to the range $-0.5 \leq e(k) < 0.5$, so that some logic operations from equation 13 and FIG. 12 are not necessary.

The invention has been described in detail with particular reference to preferred embodiments thereof and examples, but it will be understood that variations and modifications can be effected within the spirit and scope of the invention.

What is claimed is:

1. A sigma-delta modulator for converting a digital input signal into a quantized output signal, comprising:
   a first-order sigma-delta modulator, comprising:
      a first adder receiving a modulator input signal and a first quantization error value, forming a first aggregate signal,
      a first delay circuit receiving the first aggregate signal and delaying the first aggregate signal by one clock unit,
      a decision circuit receiving the delayed first aggregate signal and outputting the quantized output signal, and
      a second adder receiving the delayed first aggregate signal from the first delay circuit and the quantized output signal and negating the quantized output signal, forming the first quantization error value; and
   a plurality of n parallelized branches, each branch receiving the digital input signal, a first branch of the n branches comprising the first-order sigma-delta modulator and outputting the quantized output signal and a first quantization error value, and each branch of the n branches, other than the first branch, comprising:
      a second delay circuit receiving the digital input signal and delaying the digital input signal by i−1 clock units, where 1<i<=n,
      a switch receiving, and temporally sampling, the delayed digital input signal,
      a third adder receiving the sampled signal and a second quantization error value from the preceding branch, forming a second aggregate signal,
      a multi-bit quantizer receiving the second aggregate signal from the third adder and outputting an output signal delayed by i−1 clock units, and
      a fourth adder receiving the output signal, negated, from the multi-bit quantizer and the second aggregate signal from the third adder, forming the second quantization error value.

2. The sigma-delta modulator as claimed in claim 1, wherein:
   the first branch comprises an Integrate&Dump filter receiving the digital input signal in series with another switch, the other switch providing the modulator input signal to the first adder;
   the decision circuit of the first-order sigma-delta modulator is another multi-bit quantizer; and
   the first quantization error value is provided to the third adder of a second branch of the n branches.

3. The sigma-delta modulator as claimed in claim 2, wherein the Integrate&Dump filter, each of the multi-bit quantizers, and each of the quantization error values are arranged as a binary tree.

4. The sigma-delta modulator as claimed in claim 1, wherein the quantized output signal is calculated from the first quantization error value, the second quantization error values, and the digital input signal.

5. The sigma-delta modulator as claimed in claim 1, wherein the first quantization error value and the second quantization error values are each calculated as sub-sampled values and correspond to a quantization error value calculated at a higher sampling rate by a non-parallelized sigma-delta modulator.

6. The sigma-delta modulator as claimed in claim 1, wherein a plurality of sigma-delta modulators are cascaded in stages, forming a higher-order sigma-delta modulator.

7. A sigma-delta modulator for converting a digital input signal into a quantized output signal, comprising:
   a first-order sigma-delta modulator; and
   a plurality of n parallelized branches, each branch receiving the digital input signal, a first branch of the n branches comprising the first-order sigma-delta modulator and outputting a first quantized output signal and a quantization error value, and each branch of the n branches, other than the first branch, comprising:
      a delay circuit receiving the digital input signal and delaying the digital input signal by i−1 clock units, where 1<i<=n,
      a switch receiving, and temporally sampling, the delayed digital input signal,
      a first adder receiving the sampled signal and a second quantization error value from a preceding branch, forming an aggregate signal, the first adder of a second branch of the n branches receiving the first quantization error value from the first branch;
      a multi-bit quantizer receiving the aggregate signal from the first adder and outputting an output signal delayed by i−1 clock units, and
      a second adder receiving the output signal, negated, from the multi-bit quantizer and the aggregate signal from the first adder, forming the second quantization error value.

* * * * *